United States Patent [19]
Jones et al.

[11] Patent Number: 4,485,390
[45] Date of Patent: Nov. 27, 1984

[54] NARROW CHANNEL FET

[75] Inventors: Robert K. Jones, Centerville; Armand J. van Velthoven, West Carrollton, both of Ohio

[73] Assignee: NCR Corporation, Dayton, Ohio

[21] Appl. No.: 80,828

[22] Filed: Oct. 1, 1979

Related U.S. Application Data

[62] Division of Ser. No. 890,425, Mar. 27, 1978, Pat. No. 4,212,683.

[51] Int. Cl.³ ............................................. H01L 29/78
[52] U.S. Cl. ..................................... 357/23; 357/20; 357/41
[58] Field of Search ................... 357/23, 20, 89, 90, 357/41, 23 R, 23 D

[56] References Cited

U.S. PATENT DOCUMENTS

| | | | |
|---|---|---|---|
| 3,430,112 | 2/1969 | Hilborne | 357/23 |
| 3,476,991 | 11/1969 | Mize et al. | 357/23 |
| 4,023,195 | 5/1977 | Richman | 357/23 |
| 4,038,107 | 7/1977 | Marr et al. | 148/1.5 |
| 4,052,229 | 10/1977 | Pashley | 148/1.5 |
| 4,070,687 | 1/1978 | Ho et al. | 357/23 |
| 4,078,947 | 3/1978 | Johnson et al. | 148/1.5 |
| 4,085,498 | 4/1978 | Rideout | 357/23 |
| 4,124,933 | 11/1978 | Nicholas | 357/23 |
| 4,135,955 | 1/1979 | Gasner et al. | 357/23 |
| 4,145,233 | 3/1979 | Sefick et al. | 148/1.5 |
| 4,197,143 | 4/1980 | Berry | 357/22 |

OTHER PUBLICATIONS

Knepper, "FET Array . . . Ion Implantation," IBM TDB, 15 (Feb. 1973), 2919–2920.
Abbas et al., "Short Channel Field Effect Transistor," IBM TDB, 17 (Apr. 1975), p. 3263.

*Primary Examiner*—William D. Larkins
*Attorney, Agent, or Firm*—J. T. Cavender; Casimer K. Salys

[57] ABSTRACT

An FET comprising as many as three parallel channels having different threshold voltages. The two outer channels can have very low W/L ratios and resulting low drain-to-source currents. In one embodiment, the FET has a central enhancement channel flanked by low W/L ratio, low current, depletion channels. The FET is fabricated by forming an oxide mask (e.g., by etching a window in the gate oxide over the device active area); enhancement implanting the substrate through the window (e.g., n-substrate and n-implant for a p-channel FET); enlarging the window width a predetermined distance by etching; and depletion implanting the substrate through the window (p-implant for n-substrate) to a concentration below that of the enhancement implant. The gate structure is formed over the combined enhancement and depletion channels and a source and a drain span the ends of the channels. This effectively provides an enhancement FET which is in parallel with a depletion FET. The effective channel width of the depletion FET equals the combined width of the two narrow depletion regions and is approximately equal to the difference in width of the two etch-defined windows. The method is applicable to both silicon and metal gate technology, to n-channel and p-channel, and to various combinations of enhancement and/or depletion devices.

5 Claims, 14 Drawing Figures

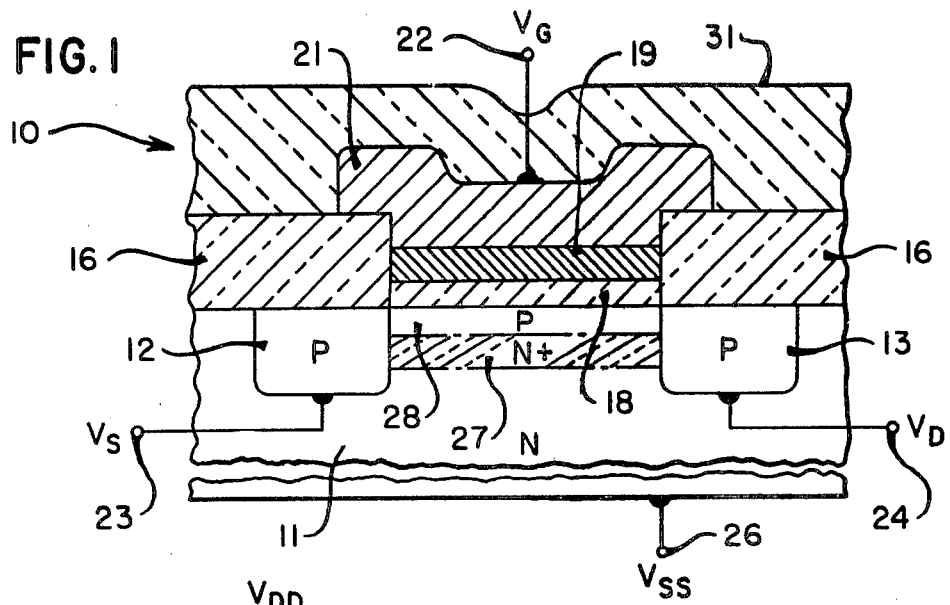
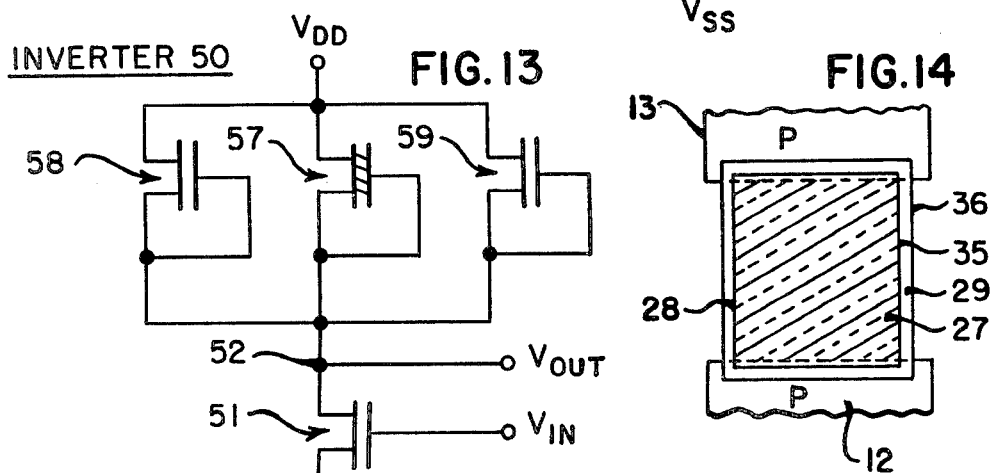
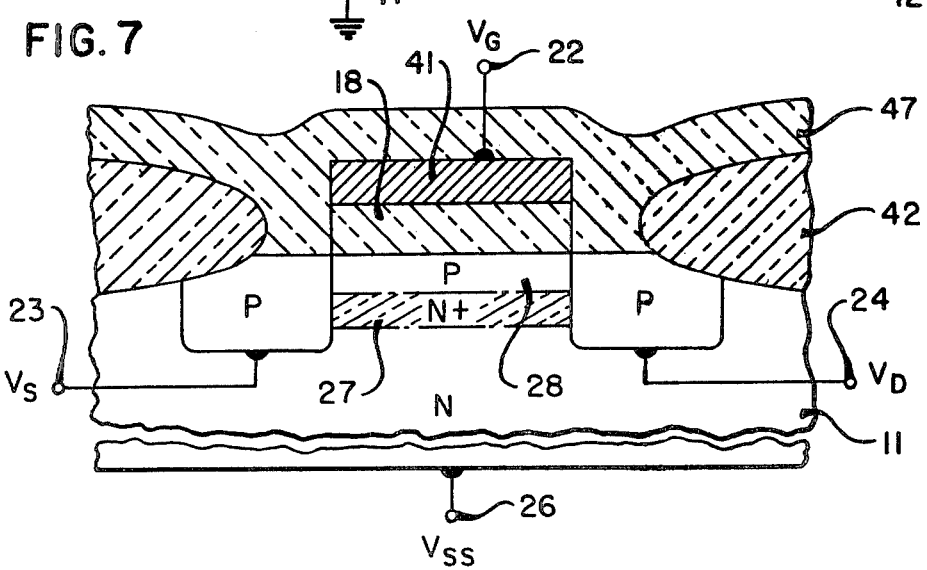

PARTIALLY
FORM FET

FORM WINDOW
34

IMPLANT
ENHANCMENT
SECTION 27

ENLARGE (ETCH)
MASK WINDOW

IMPLANT DEPLETION
SECTION(S) 28,29

DEFINE WINDOW 45
IN PARTIALLY
FORMED FET

CLEAR MASK
WINDOW

IMPLANT
ENHANCEMENT
SECTION 27

ENLARGE (ETCH)
MASK WINDOW

IMPLANT DEPLETION
SECTION (S) 28, 29

NARROW CHANNEL FET

This is a division of application Ser. No. 890,425, filed Mar. 27, 1978, now U.S. Pat. No. 4,212,683.

BACKGROUND OF THE INVENTION

This invention relates to methods for making field effect transistors and more particularly to a method for making such transistors with one or more narrow channels.

Recently, there has been much development of insulated gate field effect transistors (IGFET) which use metal insulator semiconductor (MIS) technology. The benefits of this technology include simplicity of structure and the potential for very high device density.

As such devices become increasingly smaller, it is increasingly more desirable to operate at low currents. Unfortunately, the drain to source current is proportional to the width-to-length (W/L) ratio of the device channel. One illustration of this dependency is the MOS transistor current equation, e.g., for saturation:

$$I_{DS} = -k' \frac{W}{L} (V_{GS} - V_T)^2 \qquad (1)$$

where
- $I_{DS}$ = drain to source current
- $W$ = channel width
- $L$ = channel length
- $V_{GS}$ = gate to source voltage
- $V_T$ = threshold voltage
- $k' = (\mu_p \epsilon_{ox})/(2t_{ox})$
- $\mu_p$ = avg. surface mobility of channel holes
- $\epsilon_{ox}$ = oxide permitivity
- $t_{ox}$ = thickness of the oxide over the channel.

Obviously, the drain-to-source current could be decreased by increasing the channel length dimension relative to the width, but the disadvantages of the resulting decrease in density, decrease in operational speed, etc. would probably outweigh the benefits from the decreased current.

Another approach to decreasing the W/L ratio is to decrease the width itself. However, the lower limits of channel width are conventionally limited by the photolithographic techniques used to fabricate such devices. Typically, photolithographic resolution is in the range of several (greater than 3) micrometers.

The microelectronics industry has successfully employed several techniques to avoid the limitations of photolithography and to control channel dimensions. One approach involves using a double diffusion technique, typically in which channel-forming impurities of one conductivity type are diffused into a relatively large region of the substrate, then source- or drain-forming impurities of the second conductivity type are diffused into the channel region, but to a smaller area, to precisely define a relatively short channel between the lateral edges of the diffused regions. U.S. Pat. No. 3,845,495 issued Oct. 29, 1974 to Cauge et al. uses the same oxide mask aperture for both diffusions, and uses the relative lateral diffusion of the source and channel regions to control the positioning of their lateral edges. U.S. Pat. No. 3,883,372 issued May 13, 1975 to Lin uses a glass mask having concentric apertures and apparently controls the lateral edges of the diffused regions by the extent of lateral diffusion, in the manner of Cauge et al. U.S. Pat. No. 3,863,330 issued Feb. 4, 1975 to Kraybill et al. uses the same nitride mask aperture for both diffusions and again controls the channel length by relative lateral diffusion. U.S. Pat. No. 4,038,107 issued July 26, 1977 to Marr et al. forms the source through an oxide mask aperture, forms the channel through a smaller polysilicon mask aperture, oxidizes the polysilicon mask, and then forms the drain through the still smaller, oxidized polysilicon mask aperture.

In another approach, U.S. Pat. No. 4,037,307 issued July 26, 1977 to Smith uses a mask of abutting silicon dioxide and metal oxide and forms an aperture therein by etching the silicon dioxide away from the silicon dioxide metal oxide interface. The mask aperture is then used to form a narrow gate electrode, and the gate electrode itself is used as a mask to form a closely spaced (short channel) source and drain.

Regardless of the success of these approaches, it is apparent that this exemplary prior art is not directed to the problem of decreasing channel width.

SUMMARY OF THE INVENTION

The present invention relates to a method for forming a semiconductor device such as a field effect transistor, and to the resulting transistor structure. Impurities of one conductivity type are deposited through a mask into the channel region to encompass a first section of the channel region, then the width of the mask aperture is widened, as by etching, to encompass a second channel section extending along at least one of the opposite sides of the first section. The gate electrode is formed encompassing the widened mask aperture. The second section may be doped to a different concentration and/or conductivity type than the first section to provide various parallel combinations of enhancement channel sections and/or depletion channel sections having two threshold voltages. Alternatively, the mask aperture is widened to provide a pair of outer channel sections extending along opposite sides of the first section, and the conductivity type and relative doping level of the three sections are tailored to provide as many as three different threshold voltages.

The dimensional control provided by etching permits forming each of the outer sections to a very narrow width, thus providing low current transistor action for these sections.

In an exemplary embodiment, impurities of a first conductivity type are deposited through an oxide mask into the channel region to form an enhancement section of the channel region; the width of the mask aperture is widened by etching; and impurities of the opposite conductivity type are deposited through the widened mask to form narrow depletion sections extending along the opposite sides of the enhancement section. The effective channel width of the depletion mode transistor action is the combined width of the two depletion sections.

BRIEF DESCRIPTION OF THE DRAWING

FIG. 1 is a cross-sectional view, taken parallel to the channel, of an insulated metal gate field effect transistor embodying the principles of the present invention;

FIG. 7 is a cross-sectional view, taken parallel to the channel, or an insulated silicon gate field effect transistor embodying the principles of the present invention;

FIG. 13 is a schematic of an inverter circuit which utilizes the low current device of the present invention; and FIG. 14 is a top view of FIG. 6, in schematic form, showing the mask cuts and channel section outlines in relation to the source and drain.

DETAILED DESCRIPTION

Figure 2:
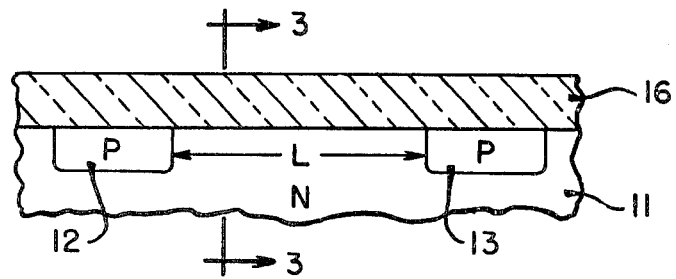
FIGS. 2-6 are cross-sectional representations of the field effect transistor of FIG. 1 during sequential stages of fabrication using the process of the present invention.

FIG. 1 is a cross-sectional view taken parallel to the channel of a low current MNOS metal gate field effect transistor 10 embodying the principles of the present invention. The transistor 10 is exemplary of a class of devices which embody the principles of the present invention. The transistor 10 comprises a substrate 11 of one conductivity type (illustratively n-type) within which spaced-apart surface-adjacent regions of the second, opposite conductivity type (p-type) form source and drain 12 and 13. A thick insulating layer 16 typically of silicon dioxide is formed on the substrate 11 for electrically isolating the device 10. A gate structure comprising a layered dual insulator and a gate electrode 21 overlies the channel region between the source 12 and the drain 13. The insulator itself comprises silicon dioxide layer 18 and a silicon nitride layer 19.

For purposes of illustration, electrical contacts 22, 23, 24 and 26 are shown connected to the metal gate 21, source 12, drain 13 and substrate 11, respectively, for applying bias voltages which control the conduction path and current across the channel region. Those skilled in the art will understand that the particular electrical contact arrangement is shown merely to facilitate description, and that usually contact is made at a single point along each of a pair of diffusion stripes which comprise the source and drain for a plurality of devices.

The thicknesses and other dimensions shown for transistor 10 are selected for clarity of illustration and are not to scale. Typical thicknesses, dictated by the current state of the art, are: source 12 and drain 13 junction depth, about 2–2.5 microns for p-channel (illustrated) and one micron for n-channel; field oxide 16, about 1.0–2.0 microns; gate oxide 18 about 400–500 Angstroms; silicon nitride layer 19 about 300–500 Angstroms; and metal gate electrode 21, about 1–1.5 microns (for a conductor such as aluminum). Also, the gate structure length (measured along the longitudinal dimension of the channel between the source and drain parallel to the plane of the drawing) and width (measured laterally of the channel length perpendicular to the plane of the drawing) are typically about 10 microns by 5 microns, but could be made smaller or larger. At least some of these dimensions, such as junction depth, can be expected to decrease with improvements in process technology. In any event, it is obvious that meaningful scale representation of such widely varying dimensions is impossible within relatively small drawing space.

Figure 6:
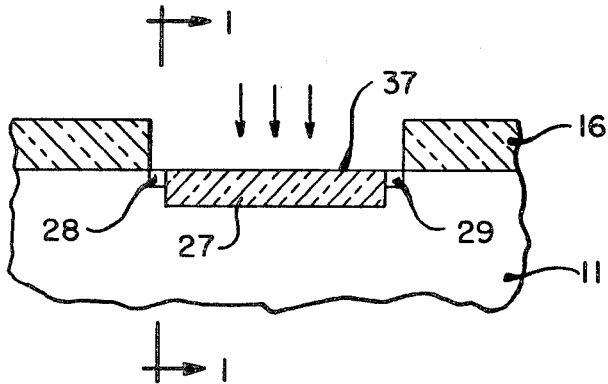

Referring further to FIG. 1, and also to FIG. 6 the illustrated transistor 10 is characterized by a channel region having a relatively large enhancement section 27 (n-type section for the n-type substrate) extending the length thereof and in parallel with one or two relatively narrow depletion sections 28 and 29 (p-type sections for the n-type substrate) which flank the enhancement section 27 at the sides thereof and also extend the length of the channel. As indicated by equation (1), the width of the enhancement section and the depletion section(s) can be varied to control the relative current magnitudes associated with the transistor action of the enhancement section and depletion section(s). Moreover, the process of the present invention can be used to provide depletion (or enhancement) sections 28 and 29 of very narrow, precisely controlled width and, thus, uniform reproducible low current depletion (enhancement) mode field effect transistors.

A metal oxide semiconductor (MOS) silicon gate embodiment 40 of the present invention is shown in FIG. 7. Equivalent elements of the transistor 40 are labeled with the same numerals used for metal gate transistor 10. Silicon gate transistor 40 also has enhancement channel section 27 and depletion channel sections 28 and 29 (see also FIG. 12). The relevant differences in structure include field oxide 42 (which is grown from the substrate 11) and polysilicon gate electrode 41 which correspond, respectively, to field oxide 16 and metal gate 21.

It should be noted that nitride layer 19 (FIG. 1) is omitted in the silicon gate structure 40. This is done to illustrate that the gate insulator can be a single- or plural-layered structure selected from materials such as silicon oxide, silicon nitride, and aluminum oxide.

The inventive method and structure are applicable to any type of device which can be formed by deposition through an oxide mask, although they are considered particularly applicable to field effect transistors. The inventive process is illustrated by the process of forming the insulated metal gate field effect transistor 10 of FIG. 1 (FIGS. 2–6) and the insulated silicon gate field effect transistor 40 of FIG. 7 (FIGS. 8–12).

FIG. 2 illustrates a typical starting point for the dual mask aperture, dual deposition process of the present invention. At this point, the partially-formed structure for transistor 10 comprises n-type substrate 11 having source 12 and drain 13 formed therein and thick field oxide 16 formed thereon. The figure is a cross-sectional view showing the length L of the channel region between the source and drain.

Briefly, as applied to the transistor 10, the crucial steps of the method of the present invention are (1) forming a mask aperture over the channel region; (2) doping the substrate through the mask aperture to provide an enhancement section of the channel region; (3) etching the aperture to increase the width by a predetermined dimension; and (4) depletion doping the substrate through the aperture.

Figure 3:
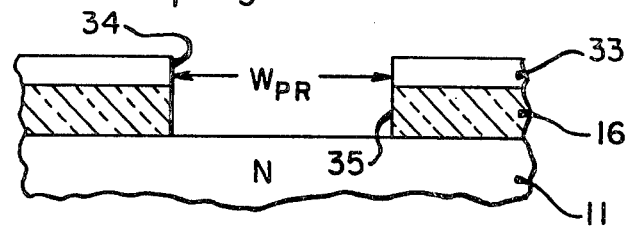

FIG. 3 is a cross-sectional view taken at right angles to FIG. 2 parallel to the channel width and illustrating the first step of the invention, the formation of the initial mask aperture. Conventional photolithographic techniques are used to form on field oxide 16 a photoresist mask 33 having etch window or aperture 34 of width $W_{pr}$ which is slightly less than the desired width of the channel region. Then, an etchant such as a buffered hydrofluoric acid comprising a 1:7 ratio by volume of hydrofluoric acid in ammonium fluoride is used to etch window or aperture 35 in the field oxide 16. Silicon dioxide is hydrophilic and silicon is hydrophobic, so a convenient technique is to continue the etching process until the exposed surface becomes hydrophobic.

Figure 4:
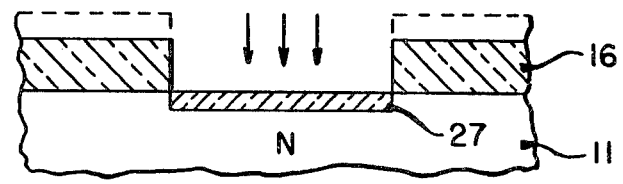

As shown in FIG. 4, the second step involves forming the enhancement channel section 27 in the substrate 11 by deposition through the mask aperture 35. This enhancement deposition may conveniently be done by heat diffusion or by ion implantation using n-type impurities such as phosphorus for the illustrated n-type substrate.

The photoresist 33 can be removed now, i.e., after the first etch, or after the first deposition step, or after the second etch, as desired. Typically, the photoresist is removed by dissolution in a material such as acetone (for positive resists).

Figure 5:
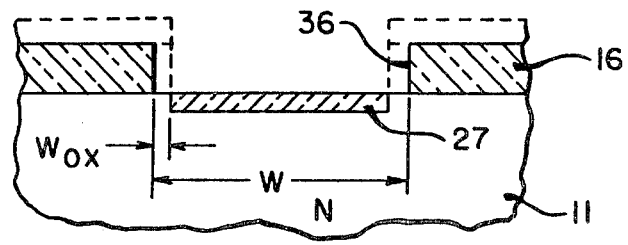

As illustrated in FIG. 5, the second mask aperture formation step (the third process step) involves time-controlled etching of the field oxide to form a second aperture 36 by widening the aperture 35 from $W_{pr}$ to the desired width of the channel region. A conventional etchant such as the buffered hydrofluoric acid (HF) is used. This is the crucial step, for the width $W_{ox}$ of the silicon dioxide removed from each longitudinal side 35 and 36 of the field oxide window determines the resulting width of the depletion sections 28 and 29. The buffered HF etchant removes silicon dioxide at a relatively slow, constant, reproducible rate (e.g., at 1500 Angstroms per minute at 32° C.), and thus permits forming the depletion sections(s) to very narrow, reproducible widths. It is thus possible to provide reproducible widths as small as about 0.1 micron for each section 28 and 29.

The initial mask aperture formation step (step 1) as well as the time-controlled second mask aperture formation step (step 3) could be done by means other than wet chemical etching, such as plasma etching or ion milling.

As shown in FIG. 6, the next crucial step is the second or depletion deposition (step four of the process). This deposition also may be conveniently done by heat diffusion or by ion implantation. Here, p-type impurities such as boron are used to form the depletion sections in the n-type substrate. Typically, the p-type impurities are deposited in sufficient concentration to provide the desired depletion threshold voltage characteristics in sections 28 and 29 without converting the enhancement threshold voltage characteristics of section 27. The resulting relationship of the channel sections 27, 28 and 29 and mask apertures 35 and 36 to source 12 and drain 13 is shown in FIG. 14, which is a schematic representation of a top view of FIG. 6.

The structure is completed to the metal gate field effect transistor 10, FIG. 1, by forming gate oxide 18 over the active area 37 (FIG. 6); adding silicon nitride layer 19; forming metal gate 21 to encompass the second, enlarged mask aperture (step 3); and forming the electrical contacts. A passivation layer 31 of silicon dioxide may also be applied. These procedures are very well understood in the art and need not be elucidated.

Using the above procedures, an exemplary low current depletion mode, metal gate transistor 10 was formed as the load device of an MNOS inverter circuit. The silicon substrate was doped to a concentration of $10^{15}$ cm$^{-3}$ background concentration of phosphorus. The active area 37 (channel region width and length) was about 5 microns by 15 microns. The source and drain comprises $5 \times 10^{-}$cm$^{-3}$ concentration of boron formed to a junction depth of about 2.0 microns. The initial oxide aperture width $W_{pr}$ formed by the first etch (FIG. 3) was about 4 microns. The first, enhancement deposition (FIG. 4) was by ion implantation of phosphorus using a dose of $3 \times 10^{12}$ cm$^{-3}$ and 50 keV. The resulting enhancement section had a peak concentration of about $5 \times 10^{17}$ atoms cm$^{-3}$ of phosphorus at a depth of about 60 nanometers. The second, depletion etch (FIG. 5) used the aforementioned buffered HF etchant at 32° C. A 20 second etch time removed 0.5 microns from each of sides 35 and 36 of the field oxide etch window 34 at the silicon surface, providing an effective width of 1.0 microns for the two depletion sections 28 and 29. The depletion deposition was by ion implantation (FIG. 6) of boron at a dose of $3 \times 10^{12}$ cm$^{-3}$ and an energy of 20 keV. The resulting 0.5 micron wide depletion regions contained $4 \times 10^{17}$ peak boron atoms per cm$^{-3}$ and were 60 nanometers deep. The threshold voltage of the enhancement channel region was $-0.5$ volt, while the threshold voltage of the depletion channel regions was $+3.5$ volts.

The schematic of the resulting inverter circuit 50 is shown in FIG. 13. The inverter 50 comprises switching transistor 51 and transistor 10, which is used as the load. Transistor 10 comprises a parallel array of transistors 57, 58, and 59, which represent the transistor action associated with enhancement section 27, and depletion sections 28 and 29, respectively. The threshold voltages of the enhancement and depletion channel sections are such that the enhancement section 27 is "off" during operation of the inverter circuit while the depletion sections 28 and 29 are "on". Consequently, the transistors associated with the depletion sections constitutes the load. In operation, increasing (decreasing) $V_{IN}$ to the gate of the input transistor 51 causes $V_{OUT}$ to drop (rise). Characteristically, the drain current, $I_{DS}$, associated with the load is needed only to maintain charge on node 52. This current requirement is much less than a microamp and any additional current is not useful and in fact is a detriment in that it dissipates power. Exemplary prior art FET inverters using a load transistor equivalent to transistor 10 (in structure, dimensions, materials), but without the low W/L channel depletion sections, have drain currents of about 15-20 microamperes for $V_{DD}=17$ volts. In contrast, for the same $V_{DD}$, the transistor 10 has a drain current of only 5 microamperes (about 2.5 microamperes for each of two equal, depletion sections 28 and 29). Since power is proportional to the current, the threefold or fourfold decrease in current provided by load transistor 10 provides a like decrease in power dissipation.

It should be noted that the inverter 50, FIG. 13, is essentially one half of a flip-flop arrangement used in static RAMs and that the transistor 10 is well suited for use as the load device in such an arrangement.

As shown in the Table, the channel region sections 28-27-29 are not limited to the above depletion-enhancement-depletion array. The exemplary depletion-enhancement-depletion array is the Type I array in the Table.

To illustrate the procedure for forming another type of array in the exemplary p-channel device, a heavy enhancement implant (n-type implant for the n-type substrate) could be made in the middle of the transistor in channel section 27 and no implant made in the narrow side sections 28 and 29. For example, after forming the initial aperture or window 34 (Step 1, FIG. 3), phosphorus atoms are implanted through the aperture to form an enhancement section 27 (Step 2, FIG. 4); then the aperture 34 is enlarged (Step 3, FIG. 5); the second deposition step (Step 4, FIG. 6), is omitted; and the gate structure is formed encompassing the enlarged mask aperture. This procedure forms relatively low magnitude threshold voltage enhancement sections 28 and 29 at the sides of relatively high magnitude threshold voltage enhancement section 27. This structure is denoted Type II in the Table.

TABLE

CHANNEL SECTION ARRANGEMENTS

| ARRAY TYPE | CHANNEL SECTION | | |
|---|---|---|---|
| | 28 | 27 | 29 |
| I | depletion[2] | enhancement[1] | depletion[3] |
| II | enhancement[2] | enhancement[1] | enhancement[3] |
| III | enhancement[2] | depletion[1] | enhancement[3] |
| IV | depletion[2] | depletion[1] | depletion[3] |

The reader will note that superscripts are used in the Table. They indicate the possible different threshold voltages within each array and that the threshold voltages of like mode channel sections (enhancement or depletion) can be varied by controlling the relative doping levels, e.g., of sections 28 and 29 in Type I. This capability is of course in addition to the different threshold voltages which can be provided for different mode channel sections (enhancement or depletion) by varying the conductivity type and the doping level.

An alternative approach for effecting a Type II structure would be to do enhancement implants in both the first and second deposition steps.

A Type III structure could be formed by exchanging the enhancement and depletion implants for the exemplary p-channel transistor 10. For example, after forming the aperture or window 34 (Step 1, FIG. 3), p-type ions such as boron would be implanted in the n-substrate through the aperture to form depletion region 27 (Step 2, FIG. 4), then the aperture 34 would be enlarged (Step 3, FIG. 5) and n-type ions such as phosphorus would be implanted through the enlarged aperture to form enhancement sections 28 and 29 in the n-substrate.

Where the background doping level of the substrate provides a suitable enhancement mode threshold voltage for sections 28 and 29, the above procedure can be modified by omitting the second, enhancement implant (Step 4).

Still another structural arrangement involves a depletion-depletion-depletion arrangement, Type IV in the Table. To illustrate one approach, after forming the aperture 34, a heavy depletion implant of p-type ions is made in the middle transistor section 27, then the aperture 34 is enlarged, and another depletion implant is made to form depletion side sections 28 and 29 of relatively low magnitude threshold voltage surrounding depletion center section 27 of relatively high magnitude threshold voltage.

A transistor having only two channel sections is also possible. For example, during the mask aperture enlargement step (Step 3, FIG. 5), one side of the mask aperture 34 could be protected by a mask and a direction-dependent etching technique such as ion milling used to remove material only from the unprotected side of the aperture. The second implant (Step 4, FIG. 6) could be applied or not, as desired, to the single channel section 28 or 29 which is exposed by the aperture enlargement step. Thus, when the gate electrode structure is formed to encompass the enlarged mask aperture, there is provided a channel region comprising the section 27 flanked by the single narrow section 28 or 29.

The threshold voltages of side channel sections 28 and 29 can be made different from one another as well as from that of center section 27 by varying the amount of dopant deposited in the sections 28 and 29 during the second deposition step. For example, and referring further to the transistor 10 in FIG. 1, transistor channel section 28 or 29 could be masked during a part of the second deposition step to provide different doping levels and, thus, different threshold voltages for the two sections. The superscripts in the Table indicate that the arrays II and IV based upon a single mode of transistor action (enhancement or depletion) can have as many as three different threshold voltages, the same as the arrays I and III based upon different modes. Those skilled in the art will also appreciate that the arrays listed in the Table are not intended to exhaust the possibilities, for there are an infinite number of possible threshold voltage combinations which include such other arrangements as depletion-enhancement-depletion and depletion-depletion-enhancement.

The transistor 10 can be n-channel also. For n-channel (p-type substrate), a Type I array having small W/L, low current depletion action is provided by first implanting p-type ions such as boron to form enhancement section 27 in the manner of FIG. 4, widening the aperture 34 (FIG. 5), then implanting n-type ions such as phosphorus to form depletion sections 28 and 29 in the manner of FIG. 6. Alternatively, for n-channel, a Type III array having low W/L, low current enhancement action is provided by using n-type ions for the first implantation step and p-type ions for the second implantation step to form a depletion section 27 flanked by narrow enhancement sections 28 and 29.

Furthermore, the Type III enhancement structures and the Type IV depletion structures can be formed in the manner of the above p-channel embodiments by using p-type and n-type implants for the enhancement and depletion structures, respectively. In short, the various methods for producing the p-channel arrangements are applicable to n-channel by switching the conductivity type of the dopants.

The illustrated transistor 10 is non-memory MNOS for conventional operating voltages. The device can be made memory MNOS by using a thin gate oxide 18 of, e.g., 20–60 Angstroms thickness. Furthermore, a thick, non-memory oxide section can be formed at either the source or the drain side of the memory oxide 18 or both to control the threshold voltage and to prevent zener breakdown between the source and substrate and/or the drain and substrate. The resulting "split gate" and "trigate" structures are described more fully in U.S. Pat. No. 3,719,866 issued to Naber and Lockwood and assigned to NCR Corporation. This patent is incorporated by reference.

Figure 8:
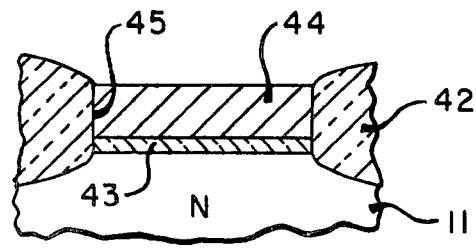
FIGS. 8-12 are cross-sectional representations of the silicon gate field effect transistor of FIG. 7 during sequential stages of fabrication using the process of the present invention.

FIG. 8 shows a typical starting point for application of the dual mask aperture, dual deposition process to silicon gate technology to form a Type I structure. The illustrative n-type substrate 11 has field oxide 42 which is grown from the silicon substrate 11. At this point, silicon dioxide layer 43 and silicon nitride layer 44 have been used to form a deposition window 45 in the field oxide 42.

The silicon dioxide layer 43 increases the adhesion of the silicon nitride layer to substrate material such as silicon and acts as a barrier to prevent the formation of hard-to-etch compounds by the silicon nitride and the silicon substrate. A thickness of about 1,000 Angstroms is suitable for the layer 43. One suitable technique is to steam grow the silicon dioxide layer at about 975° C. Other techniques such as pyrolitic decomposition and plasma deposition will be readily applied by those skilled in the art.

The silicon nitride layer is then formed over the silicon dioxide layer 43 to a thickness of, e.g., 1500 Angstroms. Exemplary techniques for forming the layer 44 include reacting ammonia, NH₃, and silane, SiH₄, in a reactor at about 800° C. or reacting ammonia and silicon tetrachloride, SiCl₄, in a furnace at about 900° C.

The silicon dioxide and silicon nitride layers are then etched using conventional photolithographic techniques to leave the silicon nitride mask 44 and the underlying silicon dioxide 43 over the device active region. Field oxide 42 is then grown about the edges of the nitride mask 44 to a thickness of about 1.5 microns (1500 Angstroms). The field oxide can be steam grown at about 975° C. The result is that the field oxide 42 has an aperture 45 formed therein which is filled by oxide 43 and nitride 44, as shown in FIG. 8. The length of the aperture 45 approximates the length of the channel region and the width is slightly less than that of the channel region.

Figure 9:
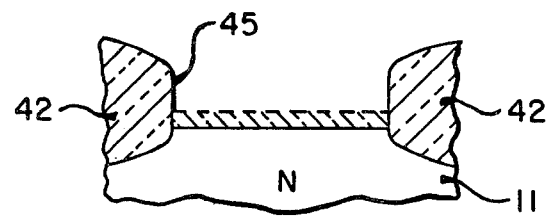

As shown in FIG. 9, next the nitride mask layer 44 is removed by etching in hot phosphoric acid. The adherence-promoting silicon dioxide layer 44 can also be removed at this point, e.g., by etching using an etchant such as the buffered 1:7 mixture by volume of hydrofluoric acid and ammonium fluoride. Removal of the silicon nitride mask 44 and the oxide layer 43 opens field oxide aperture 45 for the enhancement deposition.

Figure 10:
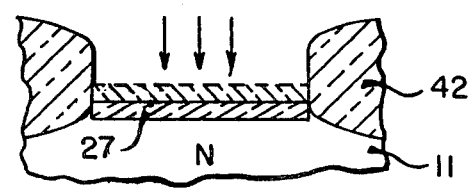

Referring to FIG. 10 the enhancement deposition described previously for the metal gate process is used to form enhancement section 27.

Figure 11:
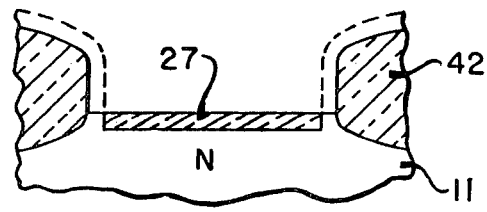

The field oxide 42 is next etched to widen the deposition aperture, as shown in FIG. 11. This technique is the same as that described for the metal gate process.

Figure 12:
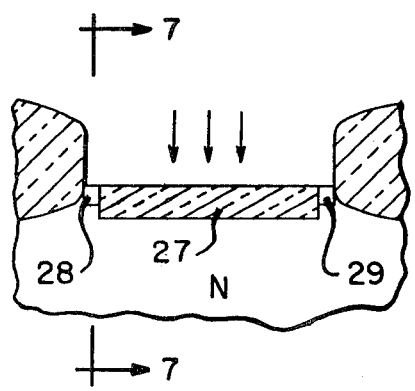

As shown in FIG. 12, the depletion implant is used to form depletion regions 28 and 29 at the sides of enhancement section 27 in the same manner as discussed relative to FIG. 6 for the metal gate process.

The silicon gate FET 40 is then completed, as shown in FIG. 7, by forming the source 12 and drain 13; forming the gate oxide 18 (e.g., 1000 Angstroms thick); adding polysilicon gate 41 (e.g., 5000 Angstroms thick); adding the contacts; and forming a passivation layer 47 of silicon dioxide or other material. Of course, the source and drain could be formed prior to the dual aperture formation-dual implantation process.

The silicon-oxide-semiconductor transistor 40 can also be memory SNOS (silicon-nitride-oxide-semiconductor) or non-memory SNOS; and n-channel or p-channel. The structure types shown in the Table can be made by modifying Steps 2-4 in the same manner as discussed for the metal gate transistor 10.

Thus, there has been described a low-current, semiconductor device and the process for forming the device. The device can be n-channel or p-channel and uses controlled widening of a deposition mask to form very narrow channel sections at one or both sides of a "center" channel section. The threshold voltages of the narrow sections may be different from one another as well as from that of the center section. Although surface field effect transistors have been described, other types of field effect transistors and, indeed, other types of structures can be formed using the present process. For example, the source and/or drain can be omitted if charge-coupled techniques are employed.

Having thus described preferred and alternative embodiments of the present invention, what is claimed is:

1. In an insulated gate field effect transistor having a channel region having length and width for forming a p-type channel approximately 5 microns wide by approximately 15 microns long in an n-type semiconductor substrate doped to a background concentration of $10^{15}$ cm$^{-3}$ of phosphorus, the improvement wherein the channel region comprises:
   a pair of p-type source and drain regions which are formed to a junction depth of about 2 microns at opposite ends of the channel region by boron of concentration $5 \times 10^{18}$ cm$^{-3}$;
   a relatively wide n-type section extending along the length of the channel region and containing majority carriers with a peak concentration of $5 \times 10^{17}$ cm$^{-3}$ phosphorus at a depth of about 16 nanometers; and
   a first relatively narrow p-type section of predetermined width ranging from approximately 0.1 microns to approximately 0.5 microns; the first relatively narrow section extending the length of the channel region at one of opposite sides of the relatively wide section and containing majority carriers doped to a peak concentration of $4 \times 10^{17}$ cm$^{-3}$ boron at a depth of about 60 nanometers.

2. The transistor of claim 1, further comprising a second relatively narrow section extending the length of the channel region on the opposite side of the relatively wide section, the second section being substantially identical to the first relatively narrow p-type section.

3. An improved channel structure for an insulated gate field effect device in which the channel region is formed in a semiconductor material, includes a gate electrode in priximity thereto, and is defined to extend longitudinally, wherein the improvement comprises:
   a first, longitudinal section of said channel region, lying substantially centered within said channel region and doped to a first impurity concentration;
   a second, longitudinal section of said channel region, significantly narrower than said first section, lying between said first longitudinal section and one side of said channel region, said second longitudinal section being doped to a second impurity concentration;
   said first and said second impurity concentrations being characterized in that said second longitudinal section forms a depletion mode channel, and said first longitudinal section forms an enhancement mode channel; and
   means for biasing the gate electrode such that said first longitudinal section is never inverted.

4. The structure recited in claim 3, wherein said channel region includes a third longitudinal section, significantly narrower than said first section, lying along the side of said channel region opposite said second longitudinal section and doped to said second impurity concentration.

5. The structure recited in claim 4, wherein the width of said first longitudinal section exceeds the width of said second longitudinal section by a factor in excess of 5.

* * * * *